015# United States Patent [19]

Wright

[11] Patent Number: 4,945,261
[45] Date of Patent: Jul. 31, 1990

[54] LEVEL AND EDGE SENSITIVE INPUT CIRCUIT

[75] Inventor: Michael E. Wright, Berkeley, Calif.

[73] Assignee: National Semiconductor Corporation, Santa Clara, Calif.

[21] Appl. No.: 329,236

[22] Filed: Mar. 27, 1989

[51] Int. Cl.$^5$ .............................................. H03K 5/20
[52] U.S. Cl. ................................... 307/443; 307/350; 307/360; 307/272.2
[58] Field of Search ............ 307/350, 354, 360, 272.2, 307/443; 328/115, 135

[56] References Cited

U.S. PATENT DOCUMENTS

| | | | |
|---|---|---|---|
| 3,513,400 | 5/1970 | Russell | 328/135 |
| 3,944,936 | 3/1976 | Pryor | 328/150 |
| 3,991,376 | 11/1976 | Stevens | 328/115 |
| 4,011,507 | 3/1977 | Rossell | 324/127 |
| 4,291,356 | 9/1981 | Mathieu | 361/87 |
| 4,308,502 | 12/1981 | Brolin | 328/151 |
| 4,352,999 | 10/1982 | Galpin | 307/354 |
| 4,529,829 | 7/1985 | Reilly et al. | 307/361 |
| 4,574,206 | 3/1986 | Todokoro et al. | 307/359 |
| 4,695,742 | 9/1987 | Randall | 307/271 |
| 4,751,408 | 6/1988 | Rambert | 307/571 |
| 4,766,335 | 8/1986 | Shirgishi et al. | 307/592 |
| 4,857,776 | 8/1989 | Khan | 307/443 |
| 4,862,020 | 8/1989 | Cowan et al. | 307/360 |

FOREIGN PATENT DOCUMENTS 0052629  4/1980  Japan ........................... 307/360

OTHER PUBLICATIONS

Fox, Discriminator, 6-1-76, New Electronics vol. 9, No. 11, p. 19.
Viles, Upper and Lower Threshold Can Be Set Independently in Latching-Comparator Circuit, 12-20-77, Electronic Design 26, pp. 176.

Primary Examiner—Stanley D. Miller
Assistant Examiner—Terry Cunningham
Attorney, Agent, or Firm—Lee Patch; Gail Woodward; Michael Glenn

[57] ABSTRACT

A level and edge sensitive input circuit can recognize a variety of types of input signals on an input line and provide a standard digital logic output for use within the equipment. The input circuit is formed from a bias circuit, two comparators, and a memory bit. The bias circuit applies a bias voltage to the input line. A first comparator inverts the state of the memory bit when the input signals are an increment above the bias voltage. The second comparator clears the state of the memory bit when the input signals are an increment below the bias voltage. In this way, the memory bit cycles through states which provide the desired output signals for use within the equipment.

10 Claims, 8 Drawing Sheets

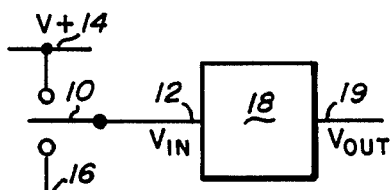
Fig_1A (PRIOR ART)
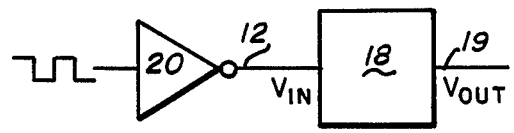
Fig_2A (PRIOR ART)
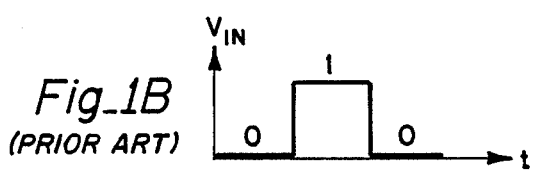
Fig_1B (PRIOR ART)
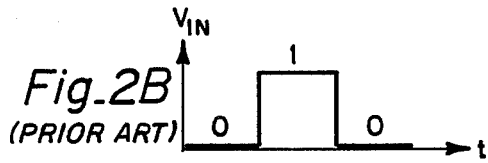
Fig_2B (PRIOR ART)
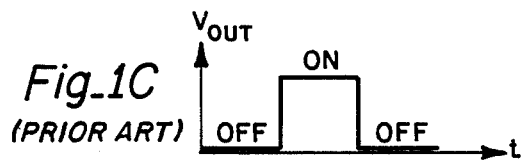
Fig_1C (PRIOR ART)
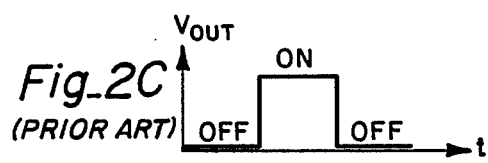
Fig_2C (PRIOR ART)
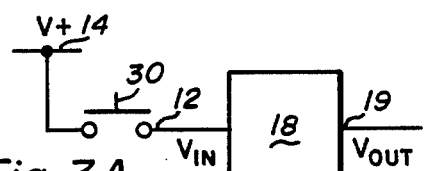
Fig_3A
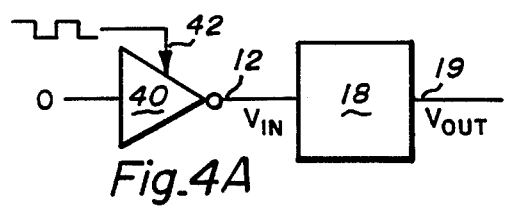
Fig_4A
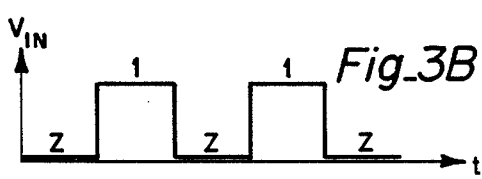
Fig_3B
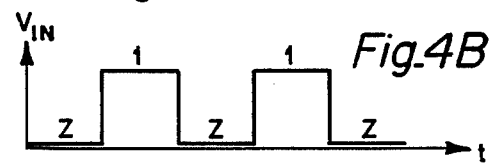
Fig_4B
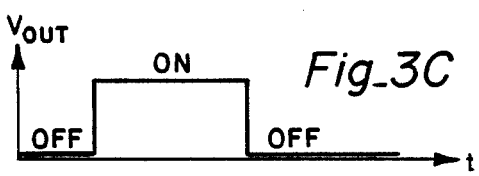
Fig_3C
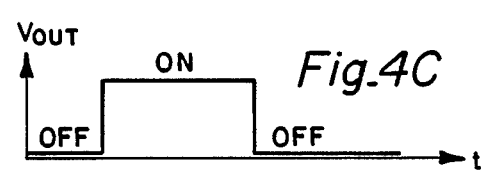
Fig_4C
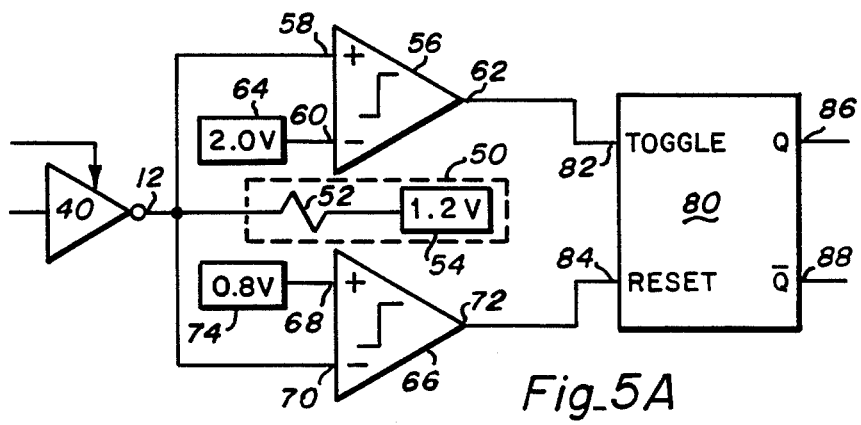
Fig_5A
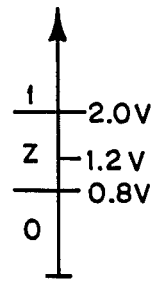
Fig_5B

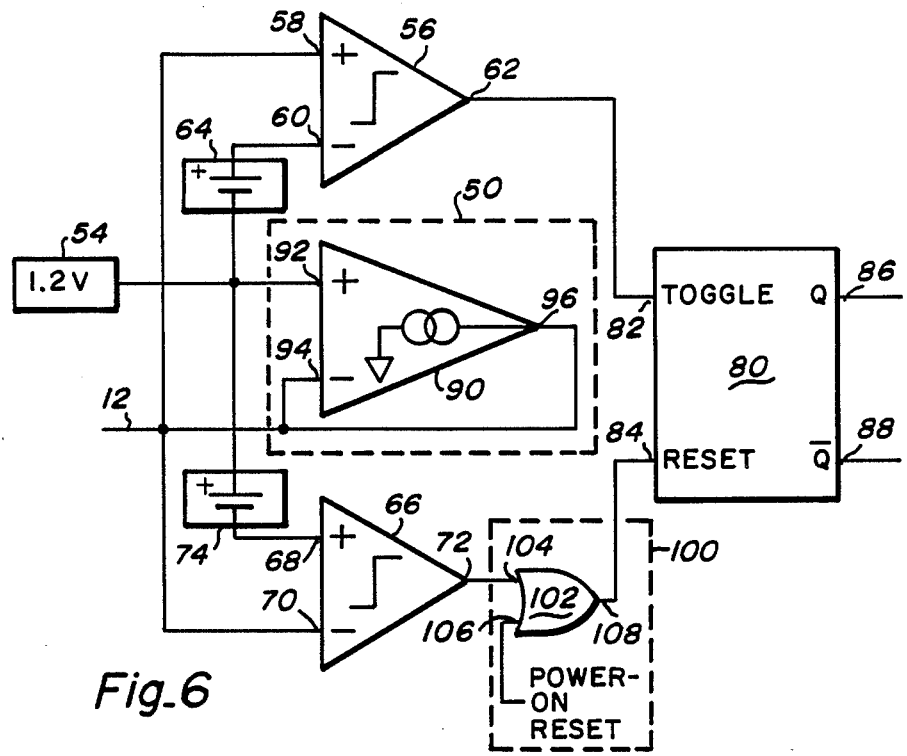
Fig_6
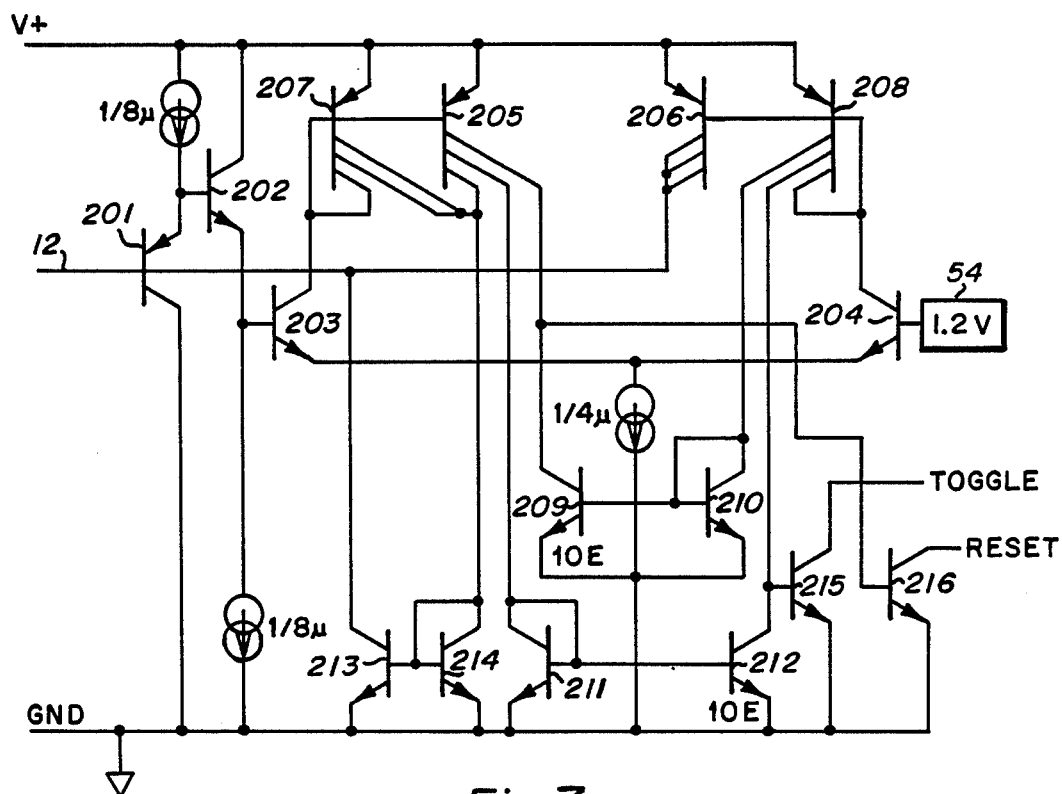
Fig_7

LEVEL AND EDGE SENSITIVE INPUT CIRCUIT

BACKGROUND OF THE INVENTION

This invention relates to an input circuit for electronic equipment. This input circuit can recognize a variety of types of input signals on an input line and provide a standard digital logic output signal for use within the equipment.

The circuit of this invention can recognize input signals from a double-throw switch, push-button switch, logic gate, or a three-state output logic gate such as a TRI-STATE® logic gate. (TRI-STATE is a registered trademark of National Semiconductor Corporation.) This input circuit can produce an output signal which follows an input signal of voltage "levels", such as from the double-throw switch or logic gate, or can produce an output signal that will alternate with an input signal's rising "edge", such as from the push-button switch or TRI-STATE logic gate.

No advance knowledge is needed of the type of switch or gate which will be driving the input circuit. According to the characteristics of the input signal, the input circuit will assume a mode of operation which will produce a useful standard digital logic output signal. In equipment with a limited number of input pins, or in integrated circuits, the ability of this input circuit to accomodate a variety of switch types can allow a reduced number of pins dedicated as input pins, with corresponding reductions in the amount of circuitry and space occupied.

For example, FIGS. 1A through 4A show four different types of switches that might be connected to the equipment's inputs:

FIG. 1A. double-throw switch;
FIG. 2A. logic gate;
FIG. 3A. push-button switch; and
FIG. 4A. TRI-STATE logic gate.

FIGS. 1B through 4B show the related input signal $V_{IN}$ of these switches, in low voltage and high voltage levels labeled as "0" and "1" respectively.

FIGS. 1C through 4C show the related output signal $V_{OUT}$ produced by a level and edge sensitive input circuit in accordance with this invention. This output signal will be of low and high voltage states labeled as "OFF" and "ON" respectively. This output signal can be used within the equipment to cycle through OFF and ON states, or other useful states of operation.

FIG. 1A shows a first type of switch that might be connected to the input line to the input circuit. A double-throw switch 10 switches an input line 12 between a voltage point 14 and a ground point 16. Input line 12 provides an input signal $V_{IN}$ to a level and edge sensitive input circuit 18 which produces an output signal $V_{OUT}$ on output line 19. FIG. 1B shows the related input signal $V_{IN}$, and FIG. 1C shows the related output signal $V_{OUT}$. When switch 10 is down, connecting input line 12 to ground 16, $V_{IN}$ is 0, and the input circuit will produce a $V_{OUT}$ of OFF. Flipping switch 10 up to connect input line 12 to voltage point 14 generates a $V_{IN}$ of 1, and a $V_{OUT}$ of ON.

FIG. 2A shows a second type of switch that might be connected to the equipment's input line. A digital logic gate 20 provides a digital logic signal to input line 12. The digital logic gate 20 might be, for example, the output stage within some preceeding but interconnected equipment. FIG. 1B shows the related input signal $V_{IN}$, and FIG. 2C shows the related output signal $V_{OUT}$. When digital logic gate 20 is providing a low signal, $V_{IN}$ is 0, and $V_{OUT}$ is OFF. When digital logic gate 20 is providing a high signal, $V_{IN}$ is 1, and $V_{OUT}$ is ON.

FIG. 3A shows a third type of switch that might be connected to the equipment's input line. A push-button switch 30, when depressed, connects input line 12 to a voltage point 14. FIG. 3B shows the related input signal $V_{IN}$, and FIG. 3C shows the related output signal $V_{OUT}$. When the push-button switch 30 is open, a high impedance or "Z" input signal appears on input line 12. When push-button switch 30 is depressed, $V_{IN}$ is 1. Upon the first press of the push-button switch 30 an ON output signal is produced. Upon the second press of the push-button switch 30 an OFF output signal is produced. This provides the familiar cycle of operation—"push once for ON, push again for OFF."

FIG. 4A shows a fourth type of switch that might be connected to the equipment's input line. A TRI-STATE digital logic gate 40 provides a digital logic signal to input line 12. A TRI-STATE gate has its logic output controlled at an Enable/Disable terminal 42. When enabled, TRI-STATE gate 40 provides its logic output. When disabled, TRI-STATE gate 40 provides a high impedance or "Z" input signal. FIG. 4B shows the related input signal $V_{IN}$, and FIG. 4C shows the related output signal $V_{OUT}$. When the TRI-STATE gate 40 moves from its Z output to a 1 input signal, an ON output signal is produced. Upon the second occurrence of the TRI-STATE gate 40 moving from its Z output to a 1 input signal, an OFF output signal is produced. This provides the familiar cycle of operation—"pulse once for ON, pulse again for OFF."

In FIGS. 3C or 4C, the initial output state is dependent on the prior history of input signals. However, in a preferred embodiment, the output is established as an OFF when power is first applied to the input circuit. Beginning from this power-up, the output sequences are as shown in FIGS. 3C and 4C.

It is an object of this invention to provide an input circuit which can recognize the input signals from any of these four different types of switches, and to translate these signals into the above-described output signals for use within the equipment.

Further, this input circuit provides the advantages of an electronic ON/OFF switch which is separate from a high-current switch in series with the power supply to the equipment. The input circuit of this invention will be operable at all times that power is supplied. It will be responsive to electronic devices such as transistors or logic gates as well as to mechanical switches. It does not require a large flow of current in or out of the input circuit on the input line. These and other advantages will become apparent to one skilled in the art from a consideration of the following description, drawings and embodiments.

SUMMARY OF THE INVENTION

This invention provides an input circuit for electronic equipment. This circuit can recognize a variety of types of input signals on an input line and provide a standard digital logic output for use within the equipment. For example, this input circuit can recognize input signals from a double-throw switch, logic gate, push-button switch, or TRI-STATE logic gate.

The input circuit is formed from a bias circuit, two comparators, and a memory bit. The input circuit receives input signals on an input line. The bias circuit applies a bias voltage to the input line. A first comparator inverts the state of the memory bit when the input signals are an increment above the bias voltage. The second comparator clears the state of the memory bit when the input signals are an increment below the bias voltage. In this way, the memory bit cycles through states which provide the desired output signal.

The bias voltage is selected to be between the low and high voltage levels to be recognized. The bias voltage can be applied by connecting the input line through a high resistance to a voltage source at the bias voltage. An alternative bias circuit uses a transconductance amplifier voltage follower with an input connected to a voltage reference at the bias voltage, and an output connected to the input line.

The memory bit can be implemented by a toggle flip-flop with a toggle input and a reset input. Applying a toggle signal to the toggle input inverts the state of the flip-flop, say from a 0 to a 1. Applying a reset signal to the reset input clears the state of the flip-flop to a 0. The output of the flip-flop provides the desired ON and OFF output signal.

By providing this capability on a single input line with a single input circuit, rather than in a multiplicity of separate input lines and circuits, reductions in circuit size and space are possible, along with the flexibility and adaptability to use any of a variety of types of switches and input signals on that single input line. This invention allows a reduction in the number of input pins required on an integrated circuit, since it can eliminate the need to have separate input pins tailored to receive each of the different types of input signals.

BRIEF DESCRIPTION OF THE DRAWINGS

FIG. 1A shows an "ON - OFF" double-throw type of switch connected to an input circuit.

FIG. 1B shows the input signal related to the "ON - OFF" double-throw type of switch of FIG. 1A.

FIG. 1C shows the output signal related to the "ON - OFF" double-throw type of switch of FIG. 1A.

FIG. 2A shows a digital logic gate providing a digital logic signal to an input circuit.

FIG. 2B shows the input signal related to the digital logic gate of FIG. 2A.

FIG. 2C shows the output signal related to the digital logic gate of FIG. 2A.

FIG. 3A shows a push-button type switch connected to an input circuit.

FIG. 3B shows the input signal related to the push-button switch of FIG. 3A.

FIG. 3C shows the output signal related to the push-button switch of FIG. 3A.

FIG. 4A shows a TRI-STATE digital logic gate connected to an input circuit.

FIG. 4B shows the input signal related to the TRI-STATE digital logic gate of FIG. 4A.

FIG. 4C shows the output signal related to the TRI-STATE digital logic gate of FIG. 4A.

FIG. 5A shows a first embodiment of an input circuit in accordance with the present invention.

FIG. 5B shows a scale of voltage levels useful in understanding the operation of the input circuit of FIG. 5A.

FIG. 6 shows a second embodiment of an input circuit in accordance with the present invention.

FIG. 7 shows a third embodiment of an input circuit in accordance with the present invention.

DESCRIPTION OF THE PREFERRED EMBODIMENTS

FIG. 5A shows a first embodiment of an input circuit in accordance with the present invention. The input circuit receives input signals on an input line 12. In this illustration, input line 12 is receiving signals from a TRI-STATE logic gate 40 as was described above and shown in FIG. 4A. These signals would vary from 0 to 5.0 volts.

A bias circuit 50 is connected to input line 12. In this embodiment, the bias circuit 50 is formed by connecting the input line 12 through a high resistance element 52, such as a 100 kilOhm resistor, to a bias voltage source 54, such as a bias voltage of 1.2 Volts. The series resistance 52 should be high enough that an input signal on line 12 can overcome the bias voltage and move input line 12 to a lower or higher voltage level.

A first comparator 56 has first input 58, second input 60, and an output 62. First input 58 is coupled to the input line 12. Second input 60 is coupled to a first voltage reference 64 of a voltage higher than the bias voltage, such as 2.0 volts.

A second comparator 66 has first input 68, second input 70, and an output 72. First input 68 is coupled to a second voltage reference 74 of a voltage lower than the bias voltage, such as 0.8 volts. Second input 70 is coupled to the input line 12.

A toggle flip-flop 80 serves as a memory bit. Toggle flip-flops are well known in the art. Toggle flip-flop 80 has a toggle input 82 connected to the output 62 of the first comparator 56. Toggle flip-flop 80 has a reset input 84 connected to the output 72 of the second comparator 66. Toggle flip-flop 80 further has complementary outputs, with a first or Q output 86, and a second or Q_output 88. The state of toggle flip-flop 80 can be read at these complementary outputs 86 and 88, and provide the useful ON and OFF output signals as described above for use within the electronic equipment.

FIG. 5B shows a scale of voltage levels useful in understanding the operation of the input circuit of FIG. 5A. When the input signal on input line 12 is of a low or 0 voltage less than the voltage of the second voltage reference 74 of 0.8 volts, then the second comparator 66 will activate its output 72 and reset the toggle flip-flop 80 on its reset input 84.

When the input signal on input line 12 is of a high or 1 voltage greater than the voltage of the first voltage reference 64 of 2.0 Volts, then the first comparator 56 will activate its output 62 and toggle the toggle flip-flop 80 on its toggle input 82.

When the input signal is of a high impedance or Z state, the applied bias voltage of 1.2 Volts from the bias circuit 50 will pull the input line 12 to a level of 1.2 Volts. In this condition, neither comparator will activate and no change of state of the toggle flip-flop 80 will occur.

It will be apparent to one skilled in the art that if the input signals of FIGS. 1B through 4B are applied to input line 12, the desired ON or OFF signals of FIGS. 1C through 4C will be produced at the first output 86 of toggle flip-flop 80.

FIG. 6 shows a second embodiment of an input circuit in accordance with the present invention. Similarly numbered elements perform similar functions as previously described. In particular the comparators 56 and 66 and the toggle flip-flop 80 perform as previously described.

However, the bias circuit 50 is now formed by a transconductance amplifier voltage follower 90. The amplifier has a first input 92 and second input 94 and an output 96. The output 96 is connected to the input line 12, which is also connected to the second input 94. The first input is connected to a bias voltage source 54, such as a bias voltage of 1.2 volts. This provides a high impedance source of bias voltage to input line 12.

FIG. 6 also shows that the first voltage reference 64 and second voltage reference 74 can be established to be only a small difference above and below the bias voltage. In particular, the small difference can be a delta $V_{BE}$, which can be established by the difference between the base to emitter voltages of two transistors operating at different current densities. This difference is easily established in integrated circuit transistors, is relatively stable and independent, and is approximately 60 milli-Volts for a 10 to 1 ratio of current densities. This difference is adequate for operation of the comparators to detect when the input signals are sufficiently above or below the bias voltage. Should the input signals have excessive noise or switch contact bounce, they can be treated by known methods before application to the input circuit.

A further feature of the embodiment of FIG. 6 is a power-on reset circuit 100 interposed in the connection from the output 72 of the second comparator 72 to the reset input 84 of the toggle flip-flop 80. The power-on reset circuit 100 is composed of an OR gate 102 with first input 104 and second input 106 and output 108. The output 72 of the second comparator 66 is connected to first input 104. Second input 106 is connected to a power-on reset signal obtained in a conventional manner such as an R-C circuit connected to the circuitry's power supply terminal. The OR gate output 108 is connected to the reset input 84 of the toggle flip-flop 80. By resetting the toggle flip-flop 80 to 0 upon power-up, the sequences of output signals will be as previously described in FIGS. 3C and 4C.

FIG. 7 shows a third embodiment of an input circuit in accordance with the present invention. This embodiment shows the applicant's preferred method of implementing the input circuit in integrated circuit transistor form.

In this embodiment, the transconductance amplifier and first and second comparators share input transistors and so can no longer be separated into discrete circuit areas. Also, the connections V+ and Gnd to a source of operating power are explicitly shown.

The transconductance amplifier 90 has a first input 92 at the base of transistor 204 and is biased to 1.2 Volts by a voltage reference 54. The second input 94 is the base of transistor 203. Amplifier output 96 is the collectors of transistor 206 and collector of transistor 213 connected to input line 12.

The input signal on line 12 is passed through buffer transistors 201 and 202 to appear at the base of transistor 203.

The first input 58 of first comparator 56 is the base of transistor 203. Second input 60 is the base of transistor 204. The 60 millivolt voltage source 64 is provided by the 10 to 1 ratio of transistors 212 and 211. Output 62 is the collector of transistor 215 and drives the Toggle input of a toggle flip-flip (not shown).

The first input 68 of second comparator 66 is at the base of transistor 204. The 60 millivolt voltage source 74 is provided by the 10 to 1 ratio of transistors 209 and 210. The second input 70 is at the base of transistor 203.

Output 72 is the collector of transistor 216 and drives the Reset input of a toggle flip-flop (not shown).

In other alternative embodiments of this invention, different methods of applying a bias voltage to the input line could be used. Clearly, many forms of comparators are known in the art which could be used in implementing the comparators used in the input circuit of this invention. Other types of memory bits, such as other types of flip-flops or latches could also be adapted in place of the illustrated toggle flip-flop. These and other changes and modifications can be made without departing from the scope of the invention, which is intended to be limited only by the scope of the following claims.

I claim:

1. An input circuit for receiving signals on an input line, and functioning to control the state of a memory element, said circuit comprising:
    bias means comprising a transconductance amplifier coupled as a voltage follower to apply a bias voltage to said input line;
    first comparator means coupled to set the state of said memory element when said input signals are a predetermined increment above said bias voltage; and
    second comparator means coupled to reset the state of said memory element when said input signals are a predetermined increment below said bias voltage.

2. An input circuit for receiving signals on an input line, and functioning to control the state of a memory element, said circuit comprising:
    bias means including a high resistance element coupled in series with a voltage reference and connected to apply a bias voltage to said input line whereby said input line is biased at said voltage reference in the absence of any input signals;
    first comparator means coupled to set the state of said memory element when said input signals are a predetermined increment above said bias voltage; and
    second comparator means coupled to reset the state of said memory element when said input signals are a predetermined increment below said bias voltage.

3. An input circuit as recited in claim 2, wherein said memory element comprises a toggle flip-flop.

4. A level and edge sensitive input circuit for receiving an input signal on an input line, said circuit comprising:
    (a) a transconductance amplifier connected as a voltage follower having its output connected to its inverting input and to said input line and its noninverting input connected to a source of bias voltage whereby said input line is operated at said bias voltage in the absence of any input signal;
    (b) a toggle flip-flop with a toggle input, a reset input and an output;
    (c) a first comparator with first and second inputs and an output, with
        said first input coupled to said input line,
        said second input coupled to a first voltage reference higher than said bias voltage and said output coupled to said toggle input of said toggle flip-flop; and
    (d) a second comparator with first and second inputs and an output, with
        said first input coupled to said input line,
        said second input coupled to a second voltage reference lower than said bias voltage, and
        said output coupled to said reset input of said toggle flip-flop.

5. A level and edge sensitive input circuit for receiving an input signal on an input line, said circuit comprising:
 (a) a high resistance coupled in series with a voltage reference and connected to said input line whereby said input line is operated at a bias voltage equal to said reference voltage in the absence of any input signal;
 (b) a toggle flip-flop having a toggle input, a reset input and an output;
 (c) a first comparator with first and second inputs and an output with said first input coupled to said input line,
  said second input coupled to a voltage reference higher than said bias voltage and said output coupled to said toggle input of said toggle flip flop; and
 (d) a second comparator with first and second inputs and an output, with said first input coupled to said input line,
  said second input coupled to a second voltage reference lower than said bias voltage, and said output coupled to said reset input of said toggle flip-flop.

6. An input circuit as recited in claim 4, wherein said first voltage reference is higher than said bias voltage and comprises:
 first and second transistors each having emitter and base electrodes;
 means for operating said first and second transistors at different current densities;
 means responsive to the difference in base to emitter voltage of said first and second transistors and means to combine said difference in base to emitter voltages of said first and second transistors with said bias voltage to create said first voltage reference.

7. An input circuit as recited in claim 4, wherein said second voltage reference is lower than said bias voltage and comprises:
 first and second transistors each having an emitter and base electrodes;
 means for operating said first and second transistors at different current densities;
 means responsive to the difference in base to emitter voltages of said first and second transistors; and
 means to combine said difference in base to emitter voltages of said first and second transistors with said bias voltage to create said second voltage reference.

8. An input circuit as recited in claim 4, wherein said output of said second comparator is coupled to said reset input of said toggle flip-flop through an OR gate with first and second inputs and an output, with
 said OR gate first input coupled to said output of said second comparator,
 said OR gate second input coupled to a power-on reset signal, and
 said OR gate output coupled to said reset input of said toggle flip-flop.

9. A method of operating a level and edge sensitive toggle flip-flop from an input circuit connected to respond to input signals on an input line, said method comprising the steps of:
 biasing said input line to a bias voltage which is predetermined to produce no toggle flip-flop response in the absence of said input signals;
 toggling said toggle flip-flop when said input signals are a predetermined increment above said bias voltage; and
 resetting said toggle flip-flop when said input signals are a predetermined increment below said base voltage.

10. A method of operating a level and edge sensitive toggle flip-flop from an input line, said method comprising the steps of:
 biasing said input line to a bias voltage selected to produce no toggle flip-flop reaction when no input signals are present;
 receiving input signals on said input line;
 generating a toggle signal when the resultant voltage on said input line exceeds a first predetermined reference higher than said bias voltage;
 generating a reset signal when said input line is below a second predetermined voltage reference lower than said bias voltage; and
 applying said toggle and reset signals to said toggle flip-flop.

* * * * *